United States Patent
Gresset

(10) Patent No.: US 11,323,137 B2
(45) Date of Patent: May 3, 2022

(54) METHOD FOR PERFORMING BELIEFS PROPAGATION, COMPUTER PROGRAM PRODUCT, NON-TRANSITORY INFORMATION STORAGE MEDIUM, AND POLAR CODE DECODER

(71) Applicant: MITSUBISHI ELECTRIC CORPORATION, Tokyo (JP)

(72) Inventor: Nicolas Gresset, Rennes (FR)

(73) Assignee: MITSUBISHI ELECTRIC CORPORATION, Tokyo (JP)

(\*) Notice: Subject to any disclaimer, the term of this patent is extended or adjusted under 35 U.S.C. 154(b) by 108 days.

(21) Appl. No.: 16/641,833

(22) PCT Filed: Oct. 3, 2018

(86) PCT No.: PCT/JP2018/037828
§ 371 (c)(1),
(2) Date: Feb. 25, 2020

(87) PCT Pub. No.: WO2019/087723
PCT Pub. Date: May 9, 2019

(65) Prior Publication Data
US 2021/0376862 A1    Dec. 2, 2021

(30) Foreign Application Priority Data
Nov. 3, 2017  (EP) .................................. 17199983

(51) Int. Cl.
*H03M 13/45* (2006.01)
*H03M 13/13* (2006.01)
*H03M 13/37* (2006.01)

(52) U.S. Cl.
CPC .......... *H03M 13/45* (2013.01); *H03M 13/13* (2013.01); *H03M 13/3753* (2013.01)

(58) Field of Classification Search
CPC ... H03M 13/45; H03M 13/13; H03M 13/3753
See application file for complete search history.

(56) References Cited

U.S. PATENT DOCUMENTS

2018/0241414 A1\*  8/2018  Gresset .............. H03M 13/1102
2019/0393897 A1\* 12/2019  Gresset ............... H03M 13/353
(Continued)

*Primary Examiner* — Thien Nguyen
(74) *Attorney, Agent, or Firm* — Birch, Stewart, Kolasch & Birch, LLP

(57) ABSTRACT

A decoder performs: computing (S501) a value $\mathcal{M}(i,j)$ of a performance-improvement metric $\mathcal{M}$ for each kernel $K_{i,j}$; and sorting (S502) the kernels in a list $\mathcal{L}$ in decreasing order of the values $\mathcal{M}(i,j)$. The decoder then performs a beliefs propagation iterative process as follows: updating (S503) output beliefs for the W top kernels of the list $\mathcal{L}$, and propagating said output beliefs as input beliefs of the neighbour kernels of said W top kernels; updating (S504) output beliefs for each neighbour kernel of said W top kernels following update of their input beliefs, and re-computing (S505) the performance-improvement metric value $\mathcal{M}(i,j)$ for each said neighbour kernel; setting (S505) the performance-improvement metric $\mathcal{M}$ for said W top kernels to a null value; and re-ordering (S506) the kernels in the list $\mathcal{L}$. Then, the decoder repeats the beliefs propagation iterative process until a stop condition is met.

13 Claims, 5 Drawing Sheets

(56) References Cited

U.S. PATENT DOCUMENTS

| | | | | |
|---|---|---|---|---|
| 2021/0135733 A1* | 5/2021 | Huang | ................. | H04B 7/0452 |
| 2021/0150747 A1* | 5/2021 | Liu | ..................... | G06N 3/0454 |
| 2021/0224619 A1* | 7/2021 | Kaltwang | ............ | G06K 9/6296 |
| 2021/0279055 A1* | 9/2021 | Saxena | ................. | G06F 9/3001 |

\* cited by examiner

METHOD FOR PERFORMING BELIEFS PROPAGATION, COMPUTER PROGRAM PRODUCT, NON-TRANSITORY INFORMATION STORAGE MEDIUM, AND POLAR CODE DECODER

TECHNICAL FIELD

The present invention generally relates to defining an order in which kernels of a polar code structure are processed during beliefs propagation, and consequently to perform the beliefs propagation by processing the kernels in the order thus defined.

BACKGROUND ART

Polar codes are linear block error correcting codes built from information theory considerations instead of relying on algebraic constructions. Polar codes are based on a structure built of multi-branched recursions of a kernel, which transforms a physical channel into virtual outer channels. When the quantity of recursions becomes large, the virtual channels tend to either have high reliability or low reliability. In other words, the virtual channels polarize. Useful data bits, also referred to as information bits, are then allocated to the most reliable virtual channels and frozen bits are allocated to the remaining virtual channels.

Encoding and decoding complexity of polar codes is in the order of $N \cdot \log(N)$, where N is the size of the considered polar code. However, performance of polar codes is rather poor, compared to other coding techniques such as Turbo codes or LDPC (Low Density Parity Check) codes, when N is small, such as N=512. Moreover, polar codes shall be optimized for a given BDMC (Binary Discrete-input Memory-less Channel) onto which said polar codes are intended to be used.

In the following, we consider a system, consisting of an encoder 110 and a decoder 120, as schematically represented in FIG. 1. The encoder 110 generates codewords according to a polar code of size $N=2^L$, where L is the global depth of the structure of the polar code. In other words, N and L are positive integers, and N is more particularly a power of "2". The generated codewords are subject to a transfer to the decoder 120 via a BDMC 130. Such a transfer can be a wired transmission, or a wireless transmission, or an intermediate storage on a non-transitory information storage medium wherein the encoder 110 stores data on the non-transitory information storage medium and the decoder 120 retrieves the data from the non-transitory information storage medium.

Let's denote $x_j$, the j'-th entry of the vector x, and $x_{j':k}$ the vector of size $(k-j'+1)$ consisting of the entries $x_{j'}, \ldots, x_{j'+1}, \ldots, x_k$ extracted from the vector x. Furthermore, let's denote $x_{j':m:k}$ the vector consisting of the entries $x_{j'}, x_{j'+m}, \ldots, x_{j'+m\lfloor(k-j')/m\rfloor}$ extracted from the vector x, wherein $\lfloor u \rfloor$ represents the floor of u.

It is thus considered herein a polar code-based encoder of rate R<1, which converts a vector b of size N consisting of information bits and frozen bits into a codeword x of size N. It has to be noted that $N \cdot R$ information bits exist amongst the N entries of the vector b. It has then to be further noted that $N \cdot (1-R)$ frozen bits exist amongst the N entries of the vector b, and the positions and values of said frozen bits inside the vector b are known by design. Most of the time, the bits are set to the value "0" and their positions inside the vector b are represented by a vector F such that $F(j')=1$ if the bit at the i-th position in the vector b carries a frozen bit and such that $F(j')=0$ if the bit at the i-th position in the vector b carries an information bit.

Thus as shown in FIG. 2A, in order to apply the polar code, a vector b' consisting of $N \cdot R$ information bits is converted by a multiplexor MUX 210, into a vector b of length N by inserting a quantity of $N \cdot (1-R)$ frozen bits according to the frozen bit positions defined by the vector F. The vector b is then processed by a polarizer (also referred to as polarization block) POL-N 220 of size N so as to encode the vector b into a codeword x of length N, which leads to a coding rate equal to R. The polarizer POL-N 220 represents the encoding part of the encoder 110. Appropriately selecting the respective positions of the frozen bits according to the structure of the polar code is crucial for achieving good decoding performance.

A major aspect of polar codes lies in the fact that the conversion from the vector b to the codeword x is static whatever the effective code rate R and effective characteristics of the considered BDMC, which means that the structure of the polar code remains constant. Rate adaptation and performance optimization are then performed by adequately choosing the positions of the frozen bits in the vector b.

As shown in the modular architecture schematically represented in FIG. 2B, the polarizer POL-N 220 of size N is built from $L \cdot N/2$ binary kernels (polarizers of size "2", as shown in FIG. 3) placed in L groups of N/2 parallel kernels separated by L−1 shufflers $\Phi_1, \ldots, \Phi_{L-1}$ of size N (it should be then noted that the L-th does not comprise such shuffler). Each shuffler distributes the entries of the input vector in a different order, with a one-to-one mapping. By definition, the binary kernel $K_{i,j}$ is the kernel located at the j-th column position at the i-th depth position (sub-polarization stage) of the structure of the polar code. Similarly, the shuffler $\Phi_i$ is located at the i-th depth position (sub-polarization stage) of the structure of the polar code.

The input of the parallel Kernels $K_{i,1}, \ldots, K_{i,N/2}$ is a vector $x_{i,1:N}^{(in)}$. (The output of the parallel Kernels $K_{i,1}, \ldots, K_{i,N/2}$ is a vector $x_{i,1:N}^{(out)}$. The relationship between the input of the parallel Kernels $K_{i+1,1}, \ldots, K_{i+1,N/2}$ at depth position i+1 and the output of the parallel Kernels $K_{i,1}, \ldots, K_{i,N/2}$ at depth position i is as follows:

$$x_{i+1,1:N}^{(in)} = \varphi_{i,1:N}^{(out)}$$

and $$x_{i,1:N}^{(out)} = \varphi_i^{-1}(x_{i+1,1:N}^{(in)})$$

where $\varphi_i$ is the shuffling operation performed by the shuffler $\Phi_i$ at the i-th depth position and $\varphi_i^{-1}$ is the inverse shuffling operation related to said shuffler $\Phi_i$ at the i-th depth position. For example, the shuffling operation $\varphi_i$ is defined as follows $$n = 2^{L-i+1}, \forall\, 0 < k \le N/n, \forall\, 0 < j \le n/2, \begin{cases} x_{i+1,(k-1)n+j}^{(in)} = x_{i+1,(k-1)n+2j-1}^{(out)} \\ x_{i+1,(k-1)n+j+n/2}^{(in)} = x_{i,(k-1)n+2j}^{(out)} \end{cases}$$

Alternatively, the shuffling operation $\varphi_i$ is defined as follows $$n = 2^{i+1}, \forall\, 0 < k \le N/n, \forall\, 0 < j \le n/2, \begin{cases} x_{i+1,(k-1)n+2j}^{(in)} = x_{i+1,(k-1)n+j}^{(out)} \\ x_{i+1,(k-1)n+2j}^{(in)} = x_{i,(k-1)n+j+n/2}^{(out)} \end{cases}$$

Others alternative mixes between the shuffler inputs may be performed by the shuffling operations, and for example, the shuffling operation performed by the shuffler $\Phi_i$ at the i-th depth position may differ from the shuffling operation performed by the shuffler $\Phi_{i-1}$ at the (i−1)-th depth position and/or from the shuffling operation performed by the shuffler $\Phi_{i+1}$ at the (i+1)-th depth position.

It can thus be noted that the vector b is thus input as concatenation of $x_{1,j'}^{(in)}$ ($\forall 0 < j' \le N$) and that the codeword x is thus output as concatenation of $x_{L,j'}^{(out)}$ ($\forall 0 < j' \le N$).

As a note, kernels that are interconnected (via one shuffler) in the structure of the polar code are designated as neighbours with respect to each other. Thus, each binary kernel has at most four neighbours since it has two inputs and two outputs. In general, it is considered that all inputs and outputs of a binary kernel are connected to different neighbours, which leads to exactly four neighbours per kernel $K_{i,1:N}$ for $1 < i < L$.

FIG. 3 schematically represents a polarizer 300 of size "2", also called binary kernel. If we consider the kernel $K_{i,j}$, two bits $x_{i,2j-1}^{(in)}$ and $x_{i,2j}^{(in)}$ are input to the polarizer 300 of size "2". Two bits $x_{i,2j-1}^{(out)}$ and $x_{i,2j}^{(out)}$ are output from the polarizer 300 of size "2". The polarizer 300 of size "2" performs a polarization operation such that $x_{i,2j-1}^{(out)}$ and $x_{i,2j}^{(out)}$ are defined as follows:

$$\begin{cases} x_{i,2j-1}^{(out)} = x_{i,2j-1}^{(in)} \oplus x_{i,2j}^{(in)} \\ x_{i,2j}^{(out)} = x_{i,2j}^{(in)} \end{cases}$$

wherein $\oplus$ represents the XOR function.

Consequently, each entry $x_{j'}$ ($\forall 0 < j' \le N$) of the output codeword x is transmitted on a BDMC defined by a transition probability $P(y_{j'}|x_{j'})$. For example, when considering an AWGN (Additive White Gaussian Noise) channel with BPSK (Binary Phase Shift Keying) input, the transition probability $P(y_{j'}|x_{j'})$ is defined by $$P(y_{j'}|x_{j'}) = \frac{\rho_{j'}}{\sqrt{2\pi}} \exp\left(-\frac{\rho_{j'}|y_{j'} - (2x_{j'} - 1)|^2}{2}\right)$$

where $\rho_{j'}$ is the signal to noise ratio of said AWGN channel.

Furthermore, Log-Likelihood Ratio (LLR) $L_{j'}^{(x)}$ can be defined as $$L_{j'}^{(x)} = \log(P(y_{j'}|x_{j'}=0)/P(y_{j'}|x_{j'}=1))$$

which characterizes the probability that $x_{j'}=1$ or $x_{j'}=0$ when observing $y_{j'}$. Positive values of $L_{j'}^{(x)}$ are associated with a higher probability to get $x_{j'}=0$. Equivalently, a priori Log-Likelihood Ratio (LLR) $L_{j'}^{(b)}$ associated with the vector b can be defined as $$\forall 0 < j' \le N, F(j')=1 \Rightarrow L_{j'}^{(b)}=+\infty, F(j')=0 \Rightarrow L_{j'}^{(b)}=0,$$

which relates that if the vector bit $b_{j'}$ is a frozen bit, the LLR is initialized to an infinity (or high enough) value since it is known for sure that the associated bit is null, while for information bit coming from the vector b', no a priori information is known (i.e. not known whether the information bit equals to "1" or "0"), which leads to a zero initialization of the LLR.

As shown in the modular architecture schematically represented in FIG. 4A, so as to be able to retrieve an estimation $\hat{b}$ of the vector b from observations y made by the decoder 120, said decoder 120 comprises an LLR computing module 421, a beliefs propagation decoder 422 and a decision maker 423, which together form the decoding part 420 of the decoder 120. The decoder 120 further includes a demultiplexer 410 that converts the estimation $\hat{b}$ of the vector b into an estimation $\hat{b}'$ of the vector b', from a knowledge of the positions of the frozen bits used by the encoder 110. The LLR computing module 421 outputs the observations in LLR form, namely a vector $L^{(x)}$ which are then used by the beliefs propagation decoder 422 in conjunction with $L^{(b)}$ being the vector of a-priori probabilities at the input of the polar code and which is initialized thanks to the prior knowledge of the frozen bits values and positions, also in LLR form, so as to output estimates $\hat{L}^{(b)}$ also in LLR form. The estimates $\hat{L}^{(b)}$ are thus refined estimates of the bits of the vector b in view of the inputs $L^{(b)}$ and $L^{(x)}$ of the decoder 120, and are then used by the decision maker 423 so as to determine the estimation $\hat{b}$ of the vector b. The beliefs propagation decoder 422 may further output estimates $\hat{L}^{(x)}$ that are refined estimates of the observations $L^{(x)}$ in view of the inputs $L^{(b)}$ and $L^{(x)}$ of the decoder, in order to iterate with other probabilistic detection blocks of the decoder 120, such as for refinement of channel estimation and/or refinement of QAM (Quadrature Amplitude Modulation) symbols demodulation in a MIMO (Multiple-Input Multiple-Output) transmission context.

The behaviour of the decoder 120 is schematically shown by the algorithm in FIG. 4B.

In a step S451, the decoder 120 initializes a vector $L^{(b)}$ first as a null vector, and then the decoder 120 modifies the vector $L^{(b)}$ according to the knowledge of the positions of the frozen bits used by the encoder 110, as follows:

$$\forall 0 < j' \le N, F(j')=1 \Rightarrow L_{j'}^{(b)}=+\infty$$

where $+\infty$ indicates that the LLR $L_{j'}^{(b)}$ of the j'-th bit gives '0' as a value for this bit with probability "1". It has to be noted that the frozen bits are initialized with a "1" value instead of "0", the value of the LLR should be "$-\infty$", and wherein "$+\infty$" is numerically represented by a value that is sufficiently high to be out of the scope of the LLR values that can exist at the input of any polarizer. It means that, for any index value that corresponds to a position of a frozen bit in the vector b, the value of the vector $L^{(b)}$ at said index value is set to infinity or a default value representative thereof, and set to "0" otherwise.

In a following step S452, the decoder 120 initializes internal variables $L_{i,1:N}^{(in)}$ and $L_{i,1:N}^{(out)}$, $\forall 0 < i \le L$, with null values. Said internal variables $L_{i,1:N}^{(in)}$ and $L_{i,1:N}^{(out)}$ are intended to be propagated along the recursions of the beliefs propagation.

In a following step S453, the decoder 120 computes beliefs propagation) using the internal variables $L_{i,1:N}^{(in)}$ and $L_{i,1:N}^{(out)}$, according to the known structure of the polar code and to the observations $L_{j'}^{(x)}$ in LLR form and to the frozen bit information $L_{j'}^{(b)}$ in LLR form. In other words, the decoder 120 uses the algorithm schematically shown in FIG. 4D by inputting therein the vector $L^{(b)}$ as $L_{1,1:N}^{(in)}$ and the vector $L^{(x)}$ as $L_{L,1:N}^{(out)}$. The output of the beliefs propagation are the vectors $\hat{L}^{(b)}$ and $\hat{L}^{(x)}$, wherein the vector $\hat{L}^{(b)}$ is then used by the decision maker 423 to determine the estimation $\hat{b}$ of the vector b.

In a following step S454, the decoder 120 makes a decision on each bit of the estimation $\hat{b}$ of the vector b according to the estimates $\hat{L}^{(b)}$ output by the beliefs propagation decoder 422. The decision is made as follows:

$$\forall\, 0 < j' \leq N, \begin{cases} \hat{L}_{j'}^{(b)} > 0 \Rightarrow \hat{b}_{j'} = 0 \\ \hat{L}_{j'}^{(b)} < 0 \Rightarrow \hat{b}_{j'} = 1 \end{cases}$$

Normally, $\hat{L}_{j'}^{(b)}$, $\forall 0<j'\leq N$, should not be equal to "0". In case such a situation however occurs, the decoder 120 arbitrarily sets the corresponding bit $\hat{b}_{j'}$ either to "0" or to "1".

Then, since the decoder 120 knows the positions of the frozen bits in the vector b, the decoder is able to extract therefrom the information bits so as to form the estimation $\hat{b}'$ of the vector b', which ends the transfer of said information bits from the encoder 110 to the decoder 120 using the polar code approach.

The behaviour of the belief propagation decoder 422, as apparent in the step S453, is schematically shown by the algorithm in FIG. 4D, by applying the factor graph schematically shown in FIG. 4C. When considering FIG. 4C, confusion shall not be made with the notations of FIG. 3. Indeed, each kernel used in the structure of the polar code to perform the polar code conversion from the vector b to the codeword x have inputs $x_{i,2j-1}^{(in)}$ and $x_{i,2j}^{(in)}$, as well as outputs $x_{i,2j-1}^{(out)}$ and $x_{i,2j}^{(out)}$. Propagation of information occurs in one direction (from left to right when considering the kernel as represented in FIG. 3). However, when considering beliefs propagation, each kernel have four inputs $L_{i,2j-1:2j}^{(in)}$ and $L_{i,2j-1:2j}^{(out)}$, as well as four outputs $\hat{L}_{i,2j-1:2j}^{(in)}$ and $\hat{L}_{i,2j-1:2j}^{(out)}$.

Belief propagation propagates probabilities (beliefs) from left to right and right to left within each kernel of the polarizer POL-N 220. Referring to a kernel $K_{i,j}$ schematically represented in FIG. 4C, let us consider input beliefs (in the form of LLR) $L_{i,2j-1:2j}^{(in)}$ from the left side of the kernel and $L_{i,2j-1:2j}^{(out)}$ from the right side of the kernel, and output beliefs (in the form of LLR) $\hat{L}_{i,2j-1:2j}^{(in)}$ from the left side of the kernel and $\hat{L}_{i,2j-1:2j}^{(out)}$ from the right side of the kernel. Update functions $\mathcal{B}_1^{(in)}$, $\mathcal{B}_2^{(in)}$, $\mathcal{B}_1^{(out)}$ and $\mathcal{B}_2^{(out)}$ linking the input beliefs to the output beliefs, are hence defined as follows:

$$\hat{L}_{i,2j-1}^{(in)} = \mathcal{B}_1^{(in)}(L_{i,2j-1:2j}^{(in)}, L_{i,2j-1:2j}^{(out)}) =$$
$$2\cdot a\tanh(\tanh((L_{i,2j}^{(in)}+L_{i,2j}^{(out)})/2)\cdot \tanh(L_{i,2j-1}^{(out)}/2))$$

$$\hat{L}_{i,2j}^{(in)} = \mathcal{B}_2^{(in)}(L_{i,2j-1:2j}^{(in)}, L_{i,2j-1:2j}^{(out)}) =$$
$$2\cdot a\tanh(\tanh(L_{i,2j-1}^{(in)}/2)\cdot \tanh(L_{i,2j-1}^{(out)}/2))+L_{i,2j}^{(out)}$$

$$\hat{L}_{i,2j-1}^{(out)} = \mathcal{B}_1^{(out)}(L_{i,2j-1:2j}^{(in)}, L_{i,2j-1:2j}^{(out)}) =$$
$$2\cdot a\tanh(\tanh((L_{i,2j}^{(in)}+L_{i,2j}^{(out)})/2)\cdot \tanh(L_{i,2j-1}^{(in)}/2))$$

$$\hat{L}_{i,2j}^{(out)} = \mathcal{B}_2^{(out)}(L_{i,2j-1:2j}^{(in)}, L_{i,2j-1:2j}^{(out)}) =$$
$$2\cdot a\tanh(\tanh(L_{i,2j-1}^{(in)}/2)\cdot \tanh(L_{i,2j-1}^{(out)}/2))+L_{i,2j}^{(in)}$$

In a step S471, the belief propagation decoder 422 computes all the values $\hat{L}_{i,2j-1:2j}^{(out)}$ and $\hat{L}_{i,2j-1:2j}^{(in)}$, $\forall 0<i\leq L$, $\forall 0<j\leq N/2$ (or in other terms, the belief propagation decoder 422 computes all the values $L_{i,j}^{(out)}$ and $\hat{L}_{i,j}^{(in)}$, $\forall 0<i\leq L$, $\forall 0<j'\leq N$), by performing the following operations:

$\hat{L}_{i,2j-1}^{(in)} = \mathcal{B}_1^{(in)}(L_{i,2j-1:2j}^{(in)}, L_{i,2j-1:2j}^{(out)})$ $\hat{L}_{i,2j}^{(in)} = \mathcal{B}_2^{(in)}(L_{i,2j-1:2j}^{(in)}, L_{i,2j-1:2j}^{(out)})$ $\hat{L}_{i,2j-1}^{(out)} = \mathcal{B}_1^{(out)}(L_{i,2j-1:2j}^{(in)}, L_{i,2j-1:2j}^{(out)})$ $\hat{L}_{i,2j}^{(out)} = \mathcal{B}_2^{(out)}(L_{i,2j-1:2j}^{(in)}, L_{i,2j-1:2j}^{(out)})$ In a following step S472, the belief propagation decoder 422 applies the shuffling inverse operations $\varphi_{i-1}^{-1}$, $\forall 1<i\leq L$, onto the data $\hat{L}_{i,1:N}^{(in)}$ so as to enable updating the data $L_{i-1,1:N}^{(out)}$ It can be noted that the data $L_{i-1,1:N}^{(out)}$ are here pre-computed and effectively updated later on in a step S474.

In a following step S473, the belief propagation decoder 422 applies the shuffling operations $\varphi_i$, $\forall 1<i<L$, onto the data $\hat{L}_{i,1:N}^{(out)}$ so as to enable updating the data $L_{i+1,1:N}^{(in)}$. It can be noted that the data $L_{i+1,1:N}^{(out)}$ are here pre-computed and effectively updated later on in the step S474.

It can further be noted that the steps S472 and S473 may be inverted or executed in parallel.

In the following step S474, the belief propagation decoder 422 updates out) and returns the beliefs $\hat{L}_{i,1:N}^{(in)}$ and $\hat{L}_{i,1:n}^{(out)}$ following the beliefs propagation performed in the steps S472 and S473.

The main strength of the polar code approach is its asymptotical optimality. The asymptotical conditions result in perfect channels (mutual information equal to "1", or error rate equal to "0") for transferring information bits and in null channels (mutual information equal to "0", or error rate equal to "1") for transferring the frozen bits. It can be seen from the above introductive description that, at finite length, channel polarization has not fully converged to perfect and null equivalent channels, leading to a non-perfect equivalent global channel with non-null error rate and non-unitary mutual information for the information bits. Furthermore, the frozen bits are thus transferred on channels with a non-null mutual information, which involves a loss in information rate since capacity is conserved by the polarizer POL-N 220.

Moreover, the polar code approach requires numerous computation operations for beliefs propagation in the decoder 120. CPU— (Central Processing Unit) or GPU— (Graphics Processing Unit) based architectures are well adapted to perform these numerous computation operations, but might encounter difficulties so as to perform them in a constrained timeframe (or within a constrained quantity of processing steps) in view of quantity of available processing resources. Under such circumstances it is usual to stop the beliefs propagation when the end of the constrained timeframe is reached (or when the constrained quantity of processing steps is reached), which generally refers to meeting a stop condition, and to make a decoding decision as is.

It is thus desirable to provide a solution that improves performance of the beliefs propagation in the decoder when a stop condition leading to make a decoding decision is met. It is further desirable to provide a solution that allows keeping low complexity benefit of the polar codes. It is further desirable to provide a solution that is simple and cost-effective.

SUMMARY OF INVENTION

To that end, the present invention concerns a method for performing beliefs propagation in a scope of polar code decoding by a decoder, the polar code having a size of N bits and being based on a structure of L sub-polarization stages of N/2 parallel kernels $K_{i,j}$, wherein N and L being positive integers such that $N=2^L$, wherein i is an index that identifies the sub-polarization stage of the kernel $K_{i,j}$ and j is an index that represents the position of said kernel $K_{i,j}$ among the N/2 parallel kernels at the sub-polarization stage identified by the index i, the N/2 parallel kernels at each sub-polarization stage are separated from their neighbour N/2 parallel kernels at each adjacent sub-polarization stage by a shuffler. The method is such that the decoder performs: computing a value $\mathcal{M}$ (i,j) of a performance-improvement metric $\mathcal{M}$ for each kernel $K_{i,j}$ of the structure, wherein the performance-improvement metric $\mathcal{M}$ is representative of a magnitude in which the input beliefs of the considered kernel $K_{i,j}$ are not in agreement and/or the performance-improvement metric $\mathcal{M}$ is representative of a magnitude in which the output beliefs of the considered kernel $K_{i,j}$ bring instantaneous information rate to the neighbour kernels of said considered kernel $K_{i,j}$; and sorting the kernels in a list $\mathcal{L}$ in decreasing order of the values $\mathcal{M}$ (i,j) of the performance-improvement metric $\mathcal{M}$. The method is further such that the decoder performs a beliefs propagation iterative process as follows: updating output beliefs for the W top kernels of the list $\mathcal{L}$, wherein W is a positive integer, and propagating said output beliefs as input beliefs of neighbour kernel of said W top kernels; updating output beliefs for each neighbour kernel of said W top kernels following update of their input beliefs, and re-computing the performance-improvement metric value $\mathcal{M}$ (i,j) for each said neighbour kernel; setting the performance-improvement metric $\mathcal{M}$ for said W top kernels to a null value; re-ordering the kernels in the list $\mathcal{L}$ in decreasing order of the values $\mathcal{M}$ (i,j) of the performance-improvement metric $\mathcal{M}$. Furthermore, the method is such that the decoder repeats the beliefs propagation iterative process until a stop condition is met.

Thus, by identifying the kernels that bring the most relevant information to the decoding process thanks to the performance-improvement metric $\mathcal{M}$ as defined above, performance of the beliefs propagation in the decoding process is improved when the stop condition is met.

According to a particular embodiment, the value $\mathcal{M}$ (i,j) of the performance-improvement metric $\mathcal{M}$ for each kernel $K_{i,j}$ depends on a difference between the sum of the information rate associated to the input beliefs of said kernel $K_{i,j}$, and the sum of the information rate associated to each input belief of said kernel $K_{i,j}$ before the previous update of said kernel $K_{i,j}$.

Thus, the magnitude in which the input beliefs of each considered kernel $K_{i,j}$ are not in agreement is used to sort the kernels and thus to improve the decoding process performance, as a first approach.

According to a particular embodiment, the value $\mathcal{M}$ (i,j)= $\mathcal{M}^{(1)}$(i,j) of the performance-improvement metric $\mathcal{M}$ for each kernel $K_{i,j}$ is defined as follows $$\mathcal{M}^{(1)}(i, j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

wherein $L_{i-2j-1:2j}^{(in)}$ are the input beliefs coming from the sub-polarization stage i−1 and $L_{i-2j-1:2j}^{(out)}$ are the input beliefs coming from the sub-polarization stage i+1, and wherein $m_{i,j}^{(1)}$ becomes $m_{i,j}^{(1)old}$ after each effective update of the kernel $K_{i,j}$, during which the output beliefs $\hat{L}_{i-2j-1:2j}^{(in)}$ and $L_{i-2j-1:2j}^{(out)}$ are computed from the input beliefs $L_{i-2j-1:2j}^{(in)}$ and $L_{i-2j-1:2j}^{(out)}$ so as to be used in a later update of the performance-improvement metric value $\mathcal{M}$(i, j)=$\mathcal{M}^{(1)}$ (i,j), and wherein $m_{i,j}^{(1)old}=0$ at the very first computation of the performance-improvement metric value $\mathcal{M}^{(1)}$(i,j) for the kernel $K_{i,j}$.

Thus, in the first approach, the magnitude in which the input beliefs of each considered kernel $K_{i,j}$ are not in agreement is easily obtained.

According to a particular embodiment, the value $\mathcal{M}$ (i,j) of the performance-improvement metric $\mathcal{M}$ for each kernel $K_{i,j}$ depends on a sum rate difference between the sum of the information rate associated to input ex-post beliefs of said kernel $K_{i,j}$, and the sum of the information rate associated to input ex-post beliefs of said kernel $K_{i,j}$ before the previous update of said kernel $K_{i,j}$, wherein ex post belief is a sum of a-priori beliefs and extrinsic beliefs.

Thus, the magnitude in which the input beliefs of each considered kernel $K_{i,j}$ are not in agreement is used to sort the kernels and thus to improve the decoding process performance, as a second approach.

According to a particular embodiment, the value $\mathcal{M}$ (i,j)= $\mathcal{M}^{(2)}$ (i,j) of the performance-improvement metric $\mathcal{M}$ for each kernel $K_{i,j}$ is defined as follows $$\mathcal{M}^{(2)}(i, j) = |m_{i,j}^{(2)} - m_{i,j}^{(2)old}|$$

wherein $$m_{i,j}^{(2)} = 1 - \frac{1}{4}\left(\log_2\left(1 + e^{-\left(L_{i,2j-1}^{(in)}+\hat{L}_{i,2j-1}^{(in)old}\right)}\right) + \log_2\left(1 + e^{-\left(L_{i,2j}^{(in)}+\hat{L}_{i,2j}^{(in)old}\right)}\right) + \log_2\left(1 + e^{-\left(L_{i,2j-1}^{(out)}+\hat{L}_{i,2j-1}^{(out)old}\right)}\right) + \log_2\left(1 + e^{-\left(L_{i,2j}^{(out)}+\hat{L}_{i,2j}^{(out)old}\right)}\right)\right)$$

wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1, and wherein $\hat{L}_{i,2j-1:2j}^{(in)old}$ represents the immediately preceding respective values of $\hat{L}_{i,2j-1:2j}^{(out)old}$ which are the output beliefs toward the sub-polarization stage i−1, and $\hat{L}_{i,2j-1:2j}^{(out)old}$ represents the immediately preceding respective values of $\hat{L}_{i,2j-1:2j}^{(out)}$ which are the output beliefs toward the sub-polarization stage i+1.

Thus, in the second approach, the magnitude in which the input beliefs of each considered kernel $K_{i,j}$ are not in agreement is easily obtained.

According to a particular embodiment, the value $\mathcal{M}$ (i,j) of the performance-improvement metric $\mathcal{M}$ for each kernel $K_{1,j}$ depends on an increase of information output by the kernel $K_{i,j}$ during the last update of said kernel $K_{i,j}$.

Thus, the magnitude in which the output beliefs of each considered kernel $K_{i,j}$ bring instantaneous information rate to the neighbour kernels of said considered kernel $K_{i,j}$ is used to sort the kernels and thus to improve the decoding process performance.

According to a particular embodiment, the value $\mathcal{M}$ (i,j)= $\mathcal{M}^{(3)}$(i,j) of the performance-improvement metric $\mathcal{M}$ for each kernel $K_{i,j}$ is defined as follows $$\mathcal{M}^{(3)}(i, j) = \left|\log_2\left(1 + e^{-\hat{L}_{i,2j-1}^{(in)}}\right) + \log_2\left(1 + e^{-\hat{L}_{i,2j}^{(in)}}\right) - \log_2\left(1 + e^{-\hat{L}_{i,2j-1}^{(out)}}\right) - \log_2\left(1 + e^{-\hat{L}_{i,2j}^{(out)}}\right)\right|$$

and wherein $\hat{L}_{i,2j-1:2j}^{(in)}$ are the output beliefs toward the sub-polarization stage i−1, and $\hat{L}_{i,2j-1:2j}^{(out)}$ are the output beliefs toward the sub-polarization stage i+1.

Thus, the magnitude in which the output beliefs of each considered kernel $K_{i,j}$ bring instantaneous information rate to the neighbour kernels of said considered kernel $K_{i,j}$ is easily obtained.

According to a particular embodiment, the value $\mathcal{M}(i,j) = \mathcal{M}^{(1)}(i,j) + \mathcal{M}^{(3)}(i,j)$ of the performance-improvement metric $\mathcal{M}$ for each kernel $K_{i,j}$ is defined as follows $$\mathcal{M}^{(1)}(i,j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

and $$\mathcal{M}^{(3)}(i,j) = \left|\log_2\left(1 + e^{-L_{i,2j-1}^{(in)}}\right) + \log_2\left(1 + e^{-L_{i,2j}^{(in)}}\right) - \log_2\left(1 + e^{-L_{i,2j-1}^{(out)}}\right) - \log_2\left(1 + e^{-L_{i,2j}^{(out)}}\right)\right|$$

wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1, wherein $\hat{L}_{i,2j-1:2j}^{(in)}$ are the output beliefs toward the sub-polarization stage i−1, and $\hat{L}_{i,2j-1:2j}^{(out)}$ are the output beliefs toward the sub-polarization stage i+1, 1) and wherein $m_{i,j}^{(1)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed from the input beliefs $L_{i,2j-1:2j}^{(in)}$ and $L_{i,2j-1:2j}^{(out)}$, so as to be used in a later update of the performance-improvement metric value $\mathcal{M}(i,j) = \mathcal{M}^{(1)}(i,j)$, and wherein $m_{i,j}^{(1)old} = 0$ at the very first computation of the performance-improvement metric value $\mathcal{M}^{(1)}(i,j)$ for the kernel $K_{i,j}$.

According to a particular embodiment, the value $\mathcal{M}(i,j) = \mathcal{M}^{(1)}(i,j) \cdot \mathcal{M}^{(3)}(i,j)$ of the performance-improvement metric $\mathcal{M}$ for each kernel $K_{i,j}$ is defined as follows $$\mathcal{M}^{(1)}(i,j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

and $$\mathcal{M}^{(3)}(i,j) = \left|\log_2\left(1 + e^{-L_{i,2j-1}^{(in)}}\right) + \log_2\left(1 + e^{-L_{i,2j}^{(in)}}\right) - \log_2\left(1 + e^{-L_{i,2j-1}^{(out)}}\right) - \log_2\left(1 + e^{-L_{i,2j}^{(out)}}\right)\right|$$

wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1, wherein $\hat{L}_{i,2j-1:2j}^{(in)}$ are the output beliefs toward the sub-polarization stage i−1, and $\hat{L}_{i,2j-1:2j}^{(out)}$ are the output beliefs toward the sub-polarization stage i+1, and wherein $m_{i,j}^{(1)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed from the input beliefs $L_{i,2j-1:2j}^{(in)}$ and $L_{i,2j-1:2j}^{(out)}$ so as to be used in a later update of the performance-improvement metric value $\mathcal{M}(i,j) = \mathcal{M}^{(1)}(i,j)$, and wherein $m_{i,j}^{(1)old} = 0$ at the very first computation of the performance-improvement metric value $\mathcal{M}^{(1)}(i,j)$ for the kernel $K_{i,j}$.

According to a particular embodiment, the stop condition is met when one of the following conditions is fulfilled: when a time period of predefined duration has ended since the beliefs propagation iterative process has started; when a predefined quantity of iterations has been performed in the beliefs propagation iterative process; and when the value $\mathcal{M}(i,j)$ of the performance-improvement metric $\mathcal{M}$ of the kernel at the top position in the list is below a predefined threshold.

Thus, processing resources are easily managed for performing the decoding process in an efficient manner.

The present invention also concerns a polar code decoder configured for performing beliefs propagation in a scope of polar code decoding, the polar code having a size of N bits and being based on a structure of L sub-polarization stages of N/2 parallel kernels $K_{i,j}$, wherein N and L being positive integers such that $N = 2^L$, wherein i is an index that identifies the sub-polarization stage of the kernel $K_{i,j}$ and j is an index that represents the position of said kernel $K_{i,j}$ among the N/2 parallel kernels at the sub-polarization stage identified by the index i, the N/2 parallel kernels at each sub-polarization stage are separated from their neighbour N/2 parallel kernels at each adjacent sub-polarization stage by a shuffler. The decoder comprises: means for computing a value $\mathcal{M}(i,j)$ of a performance-improvement metric $\mathcal{M}$ for each kernel $K_{i,j}$ of the structure, wherein the performance-improvement metric $\mathcal{M}$ is representative of a magnitude in which the input beliefs of the considered kernel $K_{i,j}$ are not in agreement and/or the performance-improvement metric $\mathcal{M}$ is representative of a magnitude in which the output beliefs of the considered kernel $K_{i,j}$ bring instantaneous information rate to the neighbour kernels of said considered kernel $K_{i,j}$; and means for sorting the kernels in a list $\mathcal{L}$ in decreasing order of the values $\mathcal{M}(i,j)$ of the performance-improvement metric $\mathcal{M}$. The decoder further comprises means for performing a beliefs propagation iterative process including: means for updating output beliefs for the W top kernels of the list $\mathcal{L}$, wherein W is a positive integer, and propagating said output beliefs as input beliefs of neighbour kernel of said W top kernels; means for updating output beliefs for each neighbour kernel of said W top kernels following update of their input beliefs, and re-computing the performance-improvement metric value $\mathcal{M}(i,j)$ for each said neighbour kernel; means for setting the performance-improvement metric $\mathcal{M}$ for said W top kernels to a null value; means for re-ordering the kernels in the list $\mathcal{L}$ in decreasing order of the values $\mathcal{M}(i,j)$ of the performance-improvement metric $\mathcal{M}$. Furthermore, the decoder is further configured for repeating the beliefs propagation iterative process until a stop condition is met.

The present invention also concerns, in at least one embodiment, a computer program that can be downloaded from a communication network and/or stored on a non-transitory information storage medium that can be read by a computer and run by a processor or processing electronics circuitry. This computer program comprises instructions for implementing the aforementioned method in any one of its various embodiments, when said program is run by the processor or processing electronics circuitry.

The present invention also concerns a non-transitory information storage medium, storing a computer program comprising a set of instructions that can be run by a processor for implementing the aforementioned method in any one of its various embodiments, when the stored information is read from the non-transitory information storage medium by a computer and run by a processor or processing electronics circuitry.

DESCRIPTION OF EMBODIMENTS

In the scope of the present invention, polar code encoding and transmission over BDMC are performed in accordance with the description provided hereinbefore with respect to FIGS. 1, 2A, 2B, 2C and 3. Polar code decoding is performed in accordance with the description provided hereinbefore with respect to FIGS. 4A, 4B and 4C. Beliefs propagation is however performed as detailed hereinafter with respect to FIGS. 5, 6 and 7.

In general, the mutual information I(x'; y') of a BDMC with input x', output y' (i.e. observations), and probability function P(y' Ix') characterizing channel transitions probabilities, is defined as follows:

$$I(x';y')=1-E_{L'}[\log_2(1+e^{-L'})]$$

where $E_{L'}[\ ]$ represents the mathematical expectation over the random variable L' called Log Likelihood Ratio (LLR) and defined as follows:

$$L'=\log(P(y'|x')/P(y'|1-x'))$$

wherein P(y'|x') and P(y'|1−x') both depend on the input bits and output channel observations.

Let us define instantaneous information rate as $1-\log_2(1+e^{-L'})$, i.e. the mathematical expectation of the instantaneous information rate provides the mutual information I (x'; y').

Figure 1:
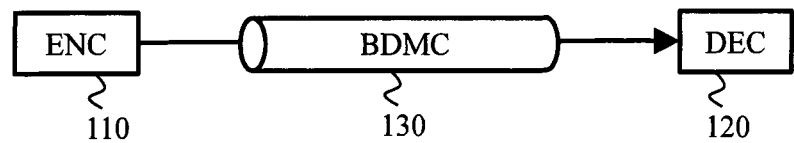
FIG. 1 schematically represents a system including a polar code encoder and a corresponding polar code decoder.
Figure 2A:
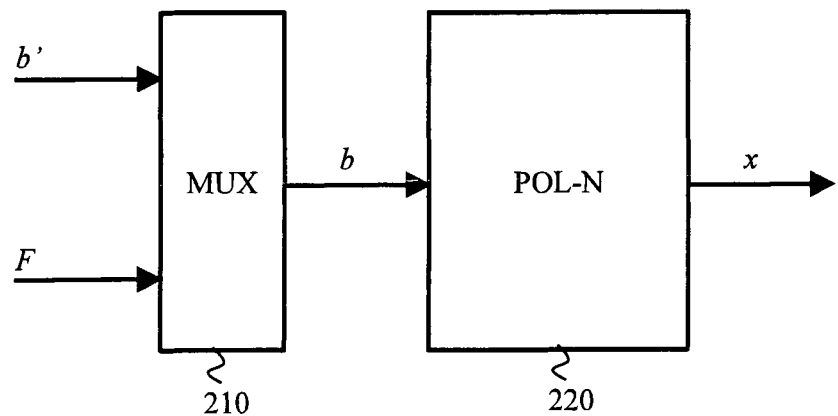
FIG. 2A schematically represents an encoding part of the encoder according to the prior art.
Figure 2B:
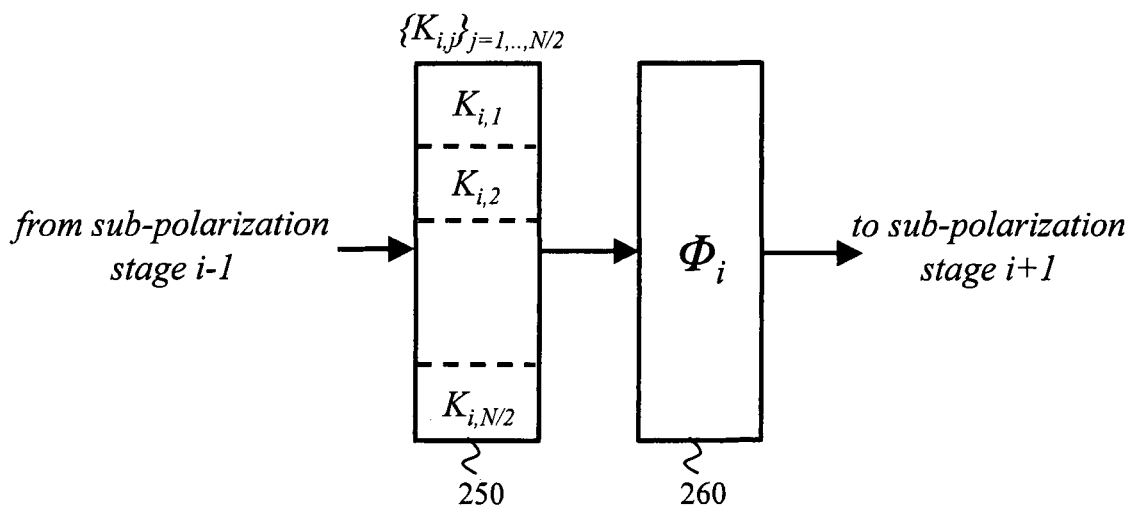
FIG. 2B schematically represents a sub-polarization stage of the encoding part according to the prior art.
Figure 3:
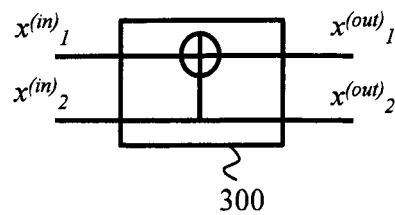
FIG. 3 schematically represents a binary kernel structure as used in the encoding part according to the prior art.
Figure 4A:
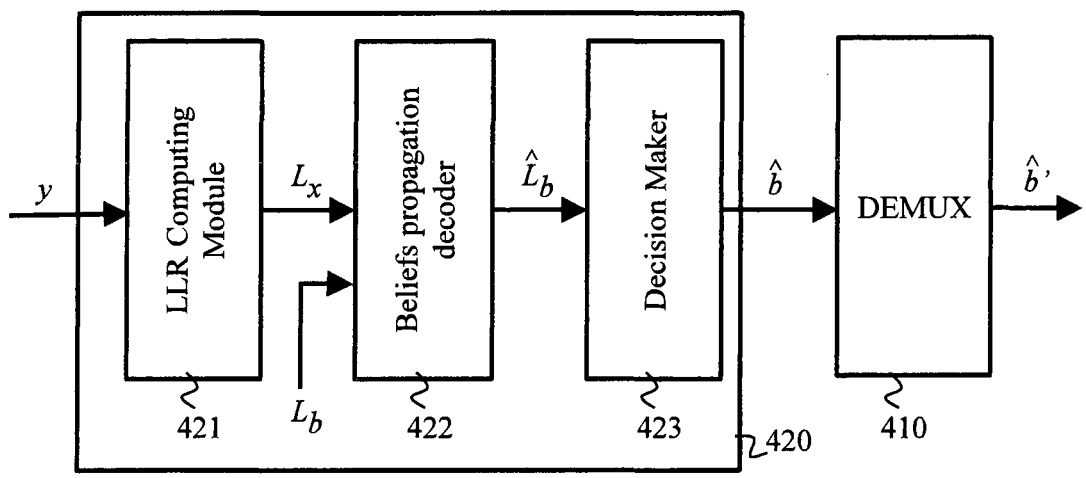
FIG. 4A schematically represents a modular architecture of the decoding part according to the prior art.
Figure 4B:
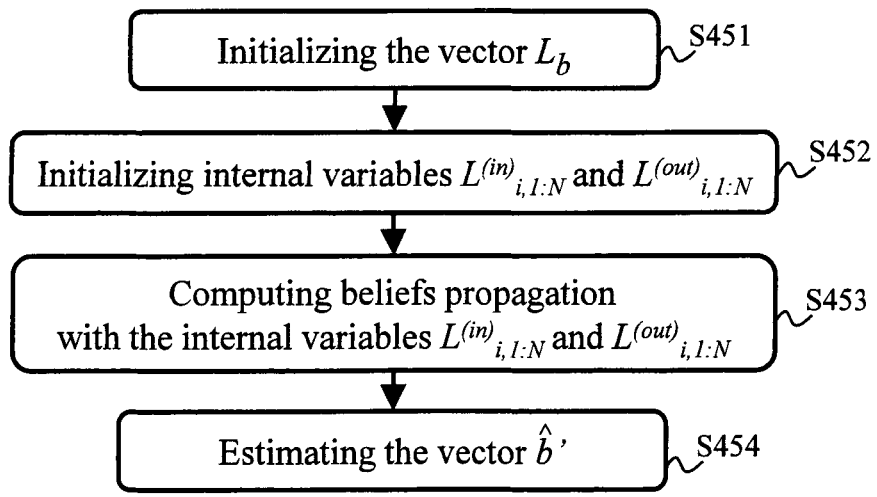
FIG. 4B schematically represents a decoding algorithm according to the prior art.
Figure 4C:
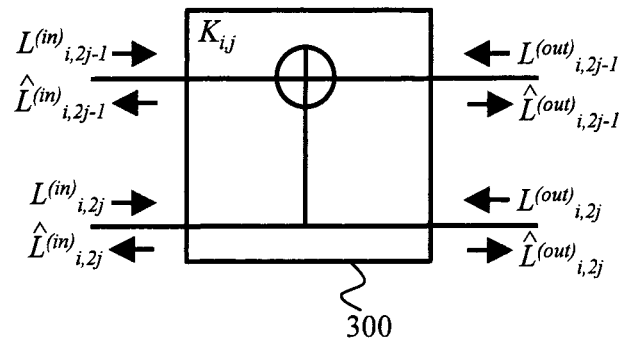
FIG. 4C schematically represents a factor graph applied to the kernel structure schematically shown in FIG. 3.
Figure 4D:
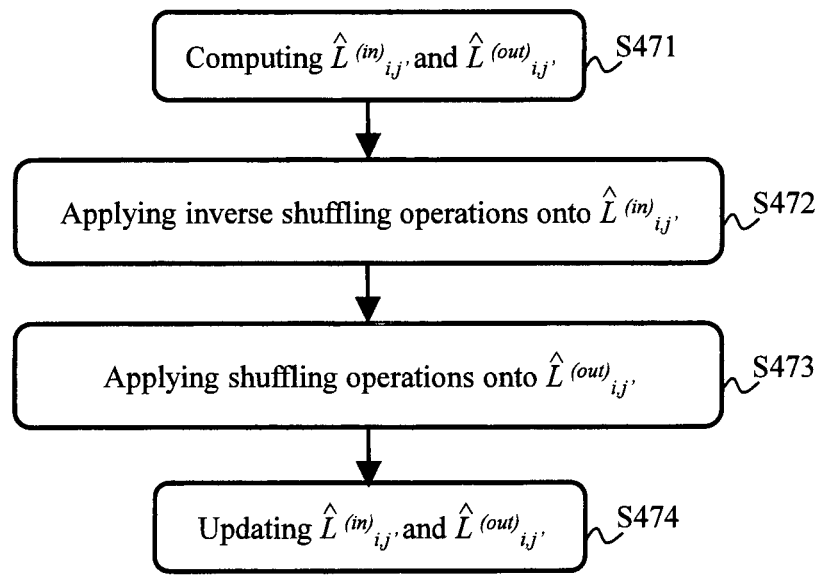
FIG. 4D schematically represents a beliefs propagation algorithm according to the prior art.

Let us consider the kernel $K_{i,j}$. Each output on the right size of the kernel (as represented in FIG. 3) is associated with a BDMC encompassing all the effects of the combinations of inputs and outputs of other kernels located at the depth positions from i+1 to L toward the transmission channel. Indeed, the operations performed by each kernel are binary operations, which does not change the BDMC nature of the channel.

Let I $(x_{i,2j-1}^{(out)}; y_{i,2j-1:2j})$ be mutual information between the bit $x_{i,2j-1}^{(out)}$ and a channel observation vector $y_{i,2j-1:2j}$.

Let also $I(x_{i,2j}^{(out)}; y_{i,2j-1:2j})$ be mutual information between the bit $x_{i,2j}^{(out)}$ and the channel observation vector $y_{i,2j-1:2j}$.

Let also $I(x_{i,2j-1}^{(in)}; y_{i,2j-1:2j})$ be mutual information between the bit $x_{i,2j-1}^{(in)}$ and the channel observation vector $y_{i,2j-1:2j}$.

Let also $I(x_{i,2j}^{(in)}; y_{i,2j-1:2j}|x_{i,2j-1}^{(in)})$ be the mutual information between the bit $x_{i,2j}^{(in)}$ and the channel observation vector $y_{i,2j-1:2j}$ knowing without error the bit $x_{i,2j-1}^{(in)}$. As a result of the polarization operation and due to the BDMC nature of the channel, the following relationship exists:

$$I(x_{i,2j-1}^{(in)}; y_{i,2j-1:2j}) + I(x_{i,2j}^{(in)}; y_{i,2j-1:2j} | x_{i,2j-1}^{(in)}) = \\ I(x_{i,2j-1}^{(out)}; y_{i,2j-1:2j}) + I(x_{i,2j}^{(out)}; y_{i,2j-1:2j})$$

which is the capacity conservation property of the considered kernel, under the assumption that $x_{i,2j-1}^{(in)}$ is correctly decoded before trying to decode $x_{i,2j}^{(in)}$.

It is worth noting that, if $L_{i,2j}^{(in)}=0$, $L_{i,2j-1}^{(in)}=(-1)^{x_{i,2j-1}^{(in)}+1} \times +\infty$, then from the computation rules of each kernel described with respect to the step S471, the following relationship can be expressed:

$$1 - \log_2\left(1 + e^{-\hat{L}_{i,2j-1}^{(in)}}\right) + 1 - \log_2\left(1 + e^{-\hat{L}_{i,2j}^{(in)}}\right) = \\ 1 - \log_2\left(1 + e^{-L_{i,2j-1}^{(out)}}\right) + 1 - \log_2\left(1 + e^{-L_{i,2j}^{(out)}}\right)$$

which involves that the conservation property is also achieved instantaneously (i.e. without the mathematical expectation being present in the information rates). This property teaches that if a kernel reaches this property after updating $\hat{L}_{i,2j-1}^{(in)}$ and $\hat{L}_{i,2j}^{(in)}$ from $L_{i,2j-1}^{(out)}$ and $L_{i,2j}^{(out)}$, then the beliefs $L_{i,2j-1}^{(out)}$ and $L_{i,2j}^{(out)}$ are in perfect agreement, which involves that the kernel is stable from iterative processing point of view. Since the kernel operations are symmetric (left to right or right to left), the same observation applies with the comparison of $\hat{L}_{i,2j-1}^{(out)}$ and $\hat{L}_{i,2j}^{(out)}$ with $L_{i,2j-1}^{(in)}$ and $L_{i,2j}^{(in)}$.

As a result, in a particular embodiment, metrics of stability of the kernel can consequently be derived and priority can be given to kernels for which the input beliefs are not in agreement, and which will provide a higher update to their neighbour kernels than other kernels that already are stable.

Moreover, in a particular embodiment, priority can be given to kernels manipulating beliefs with high instantaneous information rate, that will feed their neighbour kernels with more relevant and robust information.

By defining corresponding metrics as described hereafter, priority is given to processing the kernels providing the most beneficial increase to the decoding performance, and thus reduces complexity of the decoding process for a given performance target.

Figure 5:
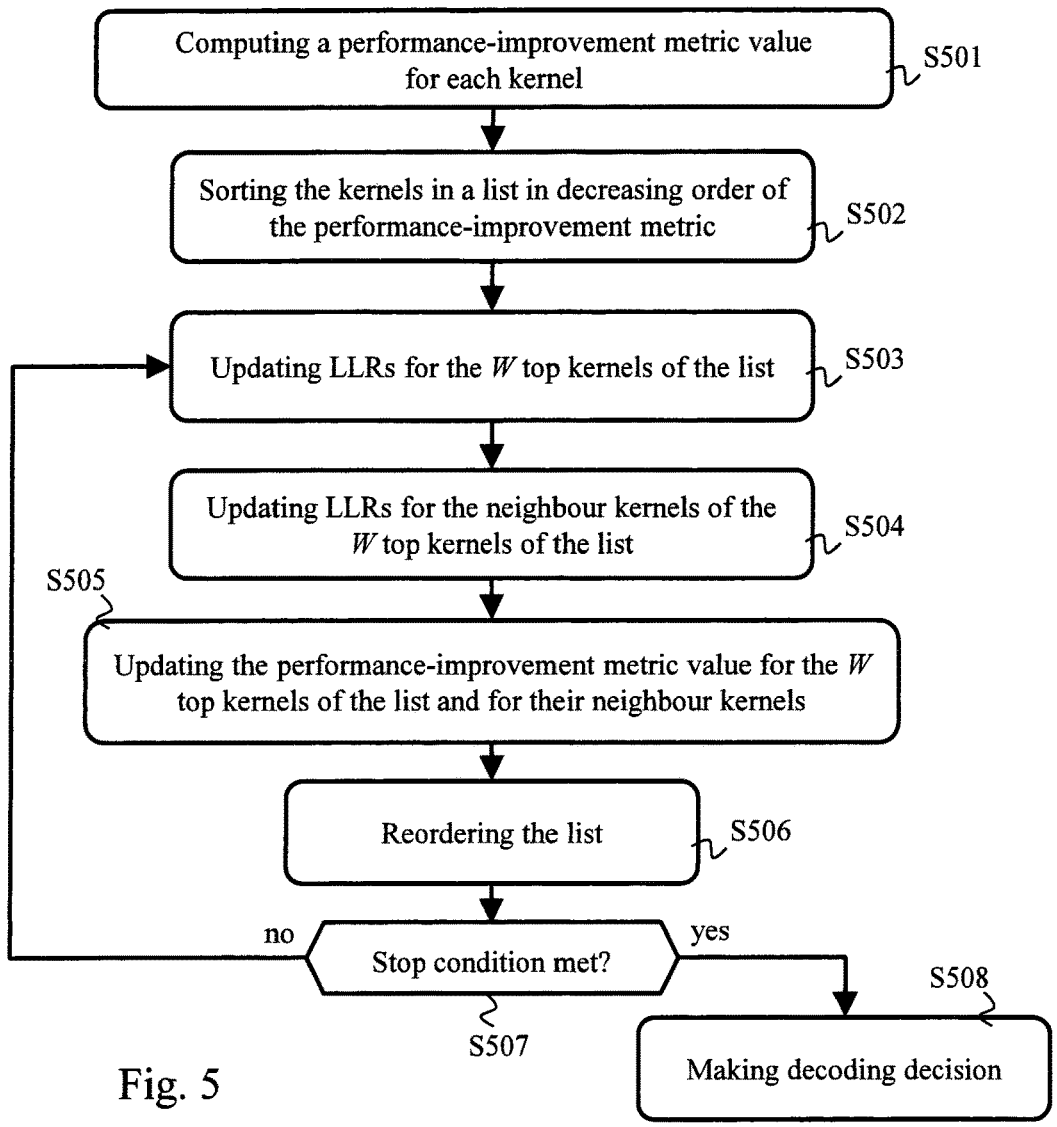
FIG. 5 schematically represents a beliefs propagation algorithm according to the present invention.

FIG. 5 schematically represents a beliefs propagation algorithm according to the present invention.

In a step S501, the decoder 120 computes a value $\mathcal{M}$ (i,j) of a performance-improvement metric $\mathcal{M}$ for each kernel $K_{i,j}$ (identified by the couple (i,j), ∀i, j), wherein i is an index such that 0<i≤L and j is an index such that 0<j≤N/2. In other words, the index i represents the depth position (sub-polarization stage) of the considered kernel $K_{i,j}$ identified by the couple (i,j) in the structure of the polar code and j represents the position of said considered kernel among the N/2 parallel kernels at the structure depth position (sub-polarization stage) identified by the index i.

As expressed by the embodiments detailed hereafter, the performance-improvement metric $\mathcal{M}$ is representative of a magnitude in which the input beliefs of the considered kernel $K_{i,j}$ are not in agreement (i.e. the higher value $\mathcal{M}$ (i,j) of the performance-improvement metric $\mathcal{M}$, the higher difference between the input beliefs) and/or the performance-improvement metric $\mathcal{M}$ is representative of a magnitude in which the output beliefs of the considered kernel $K_{i,j}$ bring instantaneous information rate to the neighbour kernels of said considered kernel $K_{i,j}$ (i.e. the higher value $\mathcal{M}$ (i,j) of the performance-improvement metric $\mathcal{M}$, the higher instantaneous information rate).

According to a first embodiment, the performance-improvement metric value $\mathcal{M}$ (i,j) for each kernel $K_{i,j}$ (thus identified by the couple (i,j)) depends on a difference between the sum of the information rate associated to the input beliefs of said kernel $K_{i,j}$, and the sum of the information rate associated to each input belief of said kernel $K_{i,j}$ before the previous update of said kernel $K_{i,j}$.

In a particular example of the first embodiment, the performance-improvement metric value $\mathcal{M}$ (i,j)=$\mathcal{M}^{(1)}$(i,j) is defined as follows in the first embodiment:

$$\mathcal{M}^{(1)}(i,j) = |m_{i,j}^{(1)} - m_{i,j}^{(1)old}|$$

wherein $$m_{i,j}^{(1)} = 1 - \frac{1}{4}(\log_2(1 + e^{-L_{i,2j-1}^{(in)}}) + \log_2(1 + e^{-L_{i,2j}^{(in)}}) + \log_2(1 + e^{-L_{i,2j-1}^{(out)}}) + \log_2(1 + e^{-L_{i,2j}^{(out)}}))$$

and wherein $m_{i,j}^{(1)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed) from the input beliefs $L_{i,2j-1:2j}^{(in)}$ and $L_{i,2j-1:2j}^{(out)}$, so as to be used in a later update of the performance-improvement metric value $\mathcal{M}$ (i,j)=$\mathcal{M}^{(1)}$(i,j), and wherein $m_{i,j}^{(1)old}$=0 at the very first computation of the performance-improvement metric value $\mathcal{M}^{(1)}$(i,j) for the kernel $K_{i,j}$.

When at least one input of the kernel $K_{i,j}$ has been updated after update of a neighbour kernel connect thereto, the kernel identified $K_{i,j}$ should also be updated. Sometimes, the update of the kernel $K_{i,j}$ has no significant change on the overall polar code performance, which involves that priority of update of the kernel $K_{i,j}$ is lower than priority of update of another kernel that experiences a drastic change in one of its inputs. The performance-improvement metric values $\mathcal{M}$ (i,j)=$\mathcal{M}^{(1)}$(i,j) thus quantitatively allow managing priorities between updates of kernels.

According to a second embodiment, the performance-improvement metric value $\mathcal{M}$ (i,j) for each kernel $K_{i,j}$ (thus identified by the couple (i,j)) depends on a sum rate difference between the sum of the information rate associated to input ex post beliefs of said kernel $K_{i,j}$, and the sum of the information rate associated to input ex post beliefs of said kernel $K_{i,j}$ before the previous update of said kernel $K_{i,j}$. Ex post belief is a sum of a-priori beliefs and extrinsic beliefs, which are characterized for example for the input identified by 2j−1 (which is the first input of the kernel $K_{i,j}$, the input identified by 2j being the second input of the kernel $K_{i,j}$) by $L_{i,2j-1}^{(in)}+\hat{L}_{i,2j-1}^{(in)old}$, wherein $L_{i,2j-1}^{(in)}$ represents here the corresponding extrinsic belief and wherein $\hat{L}_{i,2j-1}^{(in)old}$ represents here the corresponding a-priori belief.

In a particular example of the second embodiment, the performance-improvement metric value $\mathcal{M}$ (i,j)=$\mathcal{M}^{(2)}$(i,j) is defined as follows in the second embodiment:

$$\mathcal{M}^{(2)}(i,j) = |m_{i,j}^{(2)} - m_{i,j}^{(2)old}|$$

wherein $$m_{i,j}^{(2)} = 1 - \frac{1}{4}(\log_2(1 + e^{-(L_{i,2j-1}^{(in)}+\hat{L}_{i,2j-1}^{(in)old})}) + \log_2(1 + e^{-(L_{i,2j}^{(in)}+\hat{L}_{i,2j}^{(in)old})}) + \log_2(1 + e^{-(L_{i,2j-1}^{(out)}+\hat{L}_{i,2j-1}^{(out)old})}) + \log_2(1 + e^{-(L_{i,2j}^{(out)}+\hat{L}_{i,2j}^{(out)old})}))$$

and wherein $\hat{L}_{i,2j-1}^{(in)old}$ represents the immediately preceding value of $\hat{L}_{i,2j-1}^{(in)}$, $\hat{L}_{i,2j}^{(in)old}$ represents the immediately preceding value of $\hat{L}_{i,2j}^{(in)}$, $\hat{L}_{i,2j-1}^{(out)old}$ represents the immediately preceding value of $\hat{L}_{i,2j-1}^{(out)}$, and $\hat{L}_{i,2j}^{(out)old}$ represents the immediately preceding value of $L_{i,2j}^{(out)}$.

This second embodiment is close to the first embodiment, but keeps memory of the last LLR values provided to or resulting from computation of each input/output of each kernel $K_{i,j}$, $\forall$i, j. For example, by summing $L_{i,2j-1}^{(in)}$ and $\hat{L}_{i,2j-1}^{(in)old}$, information related to the ex-post belief instead of the extrinsic belief provided by $L_{i,2j-1}^{(in)}$ solely considered (as in the first embodiment) is obtained. In order to implement the second embodiment, the decoder 120 needs to store in memory $\hat{L}_{i,2j-1}^{(in)}$, $\hat{L}_{i,2j}^{(in)}$ on one hand and $\hat{L}_{i,2j-1}^{(out)}$, $\hat{L}_{i,2j}^{(out)}$ on the other hand, at each computation of each input/output of each kernel $K_{i,j}$, $\forall$i, j. The stored beliefs respectively become $\hat{L}_{i,2j-1}^{(in)old}$, $\hat{L}_{i,2j}^{*(in)old}$ on one hand and $\hat{L}_{i,2j-1}^{(out)old}$, $\hat{L}_{i,2j}^{(out)old}$ on the other hand, for a subsequent processing of said kernel $K_{i,j}$.

According to a third embodiment, the performance-improvement metric $\mathcal{M}$ (i,j) for each kernel $K_{i,j}$ (thus identified by the couple (i,j)) depends on an increase of information output by the kernel $K_{i,j}$ during the last update of said kernel $K_{i,j}$.

In a particular example of the third embodiment, the performance-improvement metric $\mathcal{M}$ (i,j)=$\mathcal{M}^{(3)}$(i,j) is defined as follows in the third embodiment:

$$\mathcal{M}^{(3)}(i,j) = |\log_2(1 + e^{-\hat{L}_{i,2j-1}^{(in)}}) + \log_2(1 + e^{-\hat{L}_{i,2j}^{(in)}}) - \log_2(1 + e^{-L_{i,2j-1}^{(out)}}) - \log_2(1 + e^{-L_{i,2j}^{(out)}})|$$

According to a fourth embodiment, the performance-improvement metric $\mathcal{M}$ (i,j) for each kernel identified by the couple (i,j) is such that $\mathcal{M}$ (i,j)=$\mathcal{M}^{(1)}$(i,j)+$\mathcal{M}^{(3)}$(i,j).

According to a fifth embodiment, the performance-improvement metric $\mathcal{M}$ (i,j) for each kernel identified by the couple (i,j) is such that $\mathcal{M}$ (i,j)=$\mathcal{M}^{(1)}$ (i,j)·$\mathcal{M}^{(3)}$ (i,j).

In a step S502, the decoder 120 sorts the kernel in a list $\mathcal{L}$ in decreasing order of the performance-improvement metric $\mathcal{M}$.

Then starts a beliefs propagation iterative process that is repeated until a stop condition is met, as detailed hereafter.

In a step S503, the decoder 120 updates the LLRs for the W top kernels in the list $\mathcal{L}$, wherein W is a positive integer such that 0<W<L·N/2, i.e. the W kernels having the highest performance-improvement metric $\mathcal{M}$. In a preferred embodiment, W=1.

In a step S504, the decoder 120 updates the LLRs for each neighbour kernel of said W top kernels in the list $\mathcal{L}$.

In a step S505, the decoder 120 sets the performance-improvement metric $\mathcal{M}$ for the W top kernels in the list $\mathcal{L}$ to a null value, since said kernels have been processed, and re-computes the performance-improvement metric $\mathcal{M}$ of their neighbour kernels.

In a step S506, the decoder 120 reorders the kernels in the list $\mathcal{L}$ following the changes made on the performance-improvement metric $\mathcal{M}$ in the step S505, still in decreasing order of the performance-improvement metric $\mathcal{M}$.

In a step S507, the decoder 120 checks whether the stop condition is met.

According to a first embodiment, the stop condition is met when a time period of predefined duration has ended since the algorithm of FIG. 5 has been launched.

According to a second embodiment, the stop condition is met when a predefined quantity of iterations has been performed since the algorithm of FIG. 5 has been launched (i.e. number of times that the step S503 has been executed since the algorithm of FIG. 5 has been launched).

According to a third embodiment, the stop condition is met when the performance-improvement metric $\mathcal{M}$ of the kernel at the top position in the list $\mathcal{L}$ is below a predefined threshold $\alpha$. Defining the threshold $\alpha$ allows tuning a trade-off between decoding performance and decoding complexity (i.e. time and/or processing resources used).

When the stop condition is met, the beliefs propagation process ends and a step S508 is performed; otherwise, the step S503 is repeated (new iteration of the beliefs propagation iterative process) with the list $\mathcal{L}$ that has been reordered in the step S506.

In the step S508, the decoder 120 makes a decoding decision in view of the beliefs propagation achieved by execution of the preceding steps of the algorithm of FIG. 5.

Figure 6:
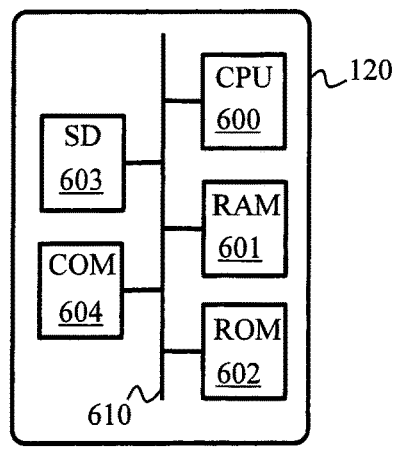
FIG. 6 schematically represents an exemplary embodiment of hardware architecture for implementing the beliefs propagation algorithm according to the present invention.

FIG. 6 schematically represents an exemplary embodiment of hardware architecture for implementing the beliefs propagation algorithm according to the present invention. According to the shown architecture, the decoder 120 comprises the following components interconnected by a communications bus 610: a processor, microprocessor, CPU 600, or a GPU; a RAM (Random-Access Memory) 601; a ROM (Read-Only Memory) 602; an SD (Secure Digital) card reader 603, or any other device adapted to read information stored on a non-transitory storage medium, such as an HDD (Hard Disk Drive); and, a communication interface 604 with BDMC onto which polar codes are used during transmissions performed by the encoder 100.

CPU 600 is capable of executing instructions loaded into RAM 601 from ROM 602 or from an external memory, such as an HDD or an SD card. After the decoder 120 has been powered on, CPU 600 is capable of reading instructions from RAM 601 and executing these instructions that form one computer program.

The steps performed by the decoder 120 may be implemented in software by execution of a set of instructions or program by a programmable computing machine, such as a PC (Personal Computer), a DSP (Digital Signal Processor) or a GPU (Graphics Processing Unit). Indeed, nowadays, GPUs are increasingly used for non-graphical calculations, since they are well-suited to other massive computing parallel problems than in traditional image-related processing. Advantageously, CPU 600 or GPU can perform polar code decoding, including notably the beliefs propagation, during inactivity time of processing resources which usually occur when inter-memory transfers are scheduled.

Figure 7:
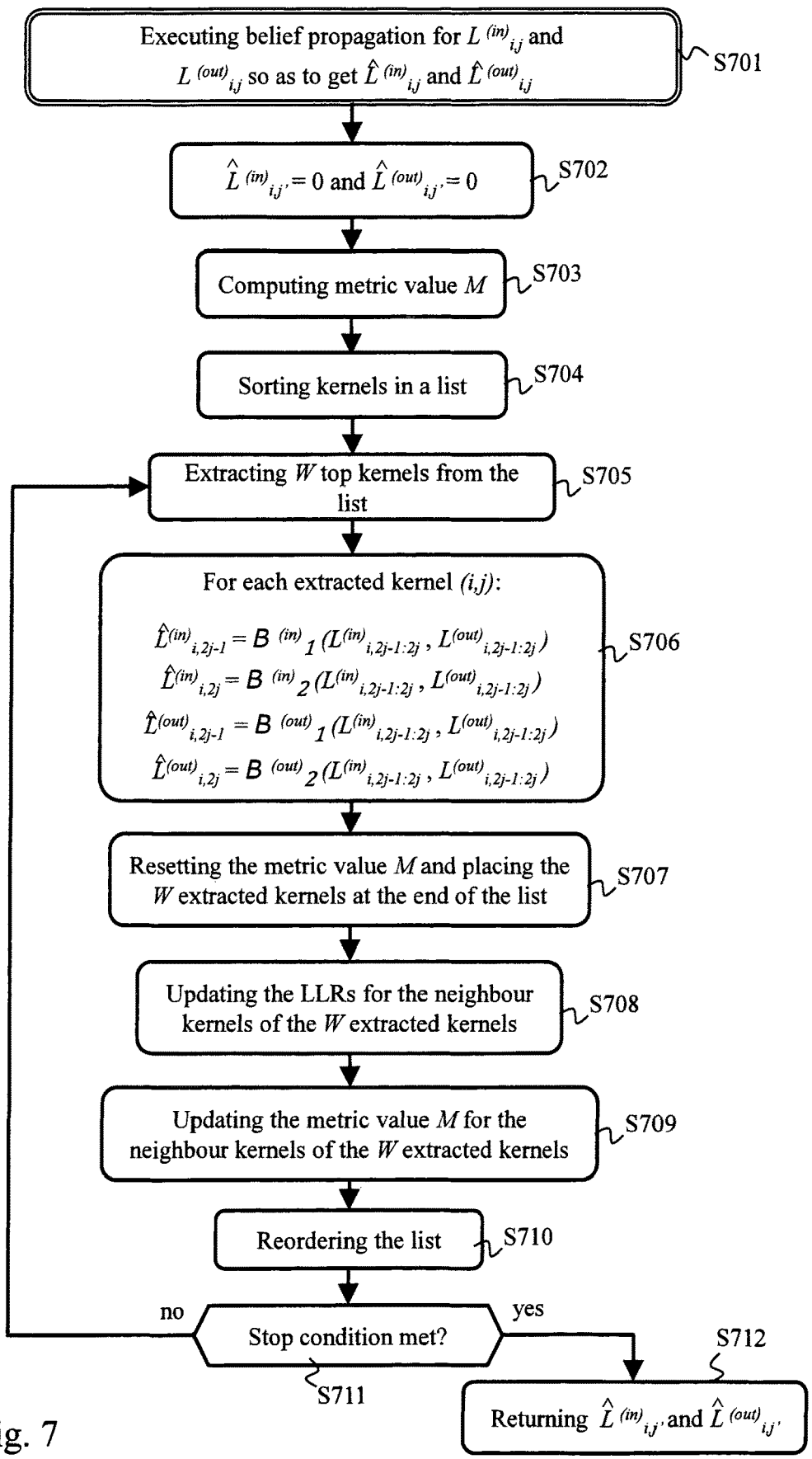
FIG. 7 schematically represents a particular embodiment of the beliefs propagation algorithm according to the present invention.

FIG. 7 schematically represents a particular embodiment of the beliefs propagation algorithm according to the present invention.

In a step S701, the decoder 120 by way of its belief propagation decoder 422, initiates a call for achieving beliefs propagation for the input beliefs $L_{i,j'}^{(in)}$ and so as to get the output beliefs $\hat{L}_{i,j'}^{(in)}$ and $\hat{L}_{i,j'}^{(out)}$, $\forall i,j'$ such that $0 < i \le L$ and $0 < j' \le N$ (the index j' is used here because the index j can not be used here since its maximum value is N/2).

In a step S702, the decoder 120 sets $\hat{L}_{i,j'}^{(in)}$ and $L_{i,j'}^{(out)}$ to a null value, $\forall i,j'$.

In a step S703, the decoder 120 computes the performance-improvement metric $\mathcal{M}$ for each kernel $K_{i,j}$ (thus identified by the couple (i,j), $\forall i,j'$ such that $0 < i \le L$ and $0 < j \le N/2$, as already described with respect to FIG. 5.

In a step S704, the decoder 120 sorts the kernel in the list $\mathcal{L}$ in decreasing order of the performance-improvement metric $\mathcal{M}$.

In a step S705, the decoder 120 extracts the W top kernels in the list $\mathcal{L}$.

In a step S706, the decoder 120 computes the output beliefs as follows, for each kernel $K_{i,j}$ among the W extracted kernels:

$$\hat{L}_{i,2j-1}^{(in)} = \mathcal{B}_1^{(in)}(L_{i,2j-1;2j}^{(in)}, L_{i,2j-1;2j}^{(out)})$$

$$\hat{L}_{i,2j}^{(in)} = \mathcal{B}_2^{(in)}(L_{i,2j-1;2j}^{(in)}, L_{i,2j-1;2j}^{(out)})$$

$$\hat{L}_{i,2j-1}^{(out)} = \mathcal{B}_1^{(out)}(L_{i,2j-1;2j}^{(in)}, L_{i,2j-1;2j}^{(out)})$$

$$\hat{L}_{i,2j}^{(out)} = \mathcal{B}_2^{(out)}(L_{i,2j-1;2j}^{(in)}, L_{i,2j-1;2j}^{(out)})$$

In a step S707, the decoder 120 resets the performance-improvement metric $\mathcal{M}$ for each kernel that has been extracted from the list $\mathcal{L}$ in the step S705. The performance-improvement metric $\mathcal{M}$ becomes then null for these kernels.

In a step S708, the decoder 120 updates the LLRs for the neighbour kernels of the W kernels that have been extracted from the list $\mathcal{L}$ in the step S705, as follows:

when $i < L$, $\hat{L}_{i,2j-1}^{(out)}$ is propagated as $L_{i+1,j''}^{(in)}$, wherein j" represents in this statement the position of the neighbour kernel at the depth position i+1 (sub-polarization stage) which is connected to the output 2j−1 of the kernel $K_{i,j}$ via the shuffler $\Phi_i$ (which, in this direction of propagation, refers to the shuffling operation $\varphi_i$) at the depth position i (sub-polarization stage);

when $i < L$, $\hat{L}_{i,2j}^{(out)}$ is propagated as $L_{i+1,j''}^{(in)}(in)_i$, wherein j" represents in this statement the position of the neighbour kernel at the depth position i+1 (sub-polarization stage) which is connected to the output 2j of the kernel $K_{i,j}$ via the shuffler $\Phi_i$ (which, in this direction of propagation, refers to the shuffling operation $\varphi_i$) at the depth position i (sub-polarization stage);

when $i > 1$, $\hat{L}_{i,2j-1}^{(in)}$ is propagated as $L_{i-1,j''}^{(out)}$, wherein j" represents in this statement the position of the neighbour kernel at the depth position i−1 (sub-polarization stage) which is connected to the output 2j−1 of the kernel $K_{i,j}$ via the shuffler $\Phi_{i-1}$ (which, in this direction of propagation, refers to the inverse shuffling operation epi $\varphi_{i-1}^{-1}$) at the depth position i−1 (sub-polarization stage); and when $i > 1$, $\hat{L}_{i,2j}^{(in)}$ is propagated as $L_{i-1,j''}^{(out)}$ wherein j" represents in this statement the position of the neighbour kernel at the depth position i−1 (sub-polarization stage) which is connected to the output 2j of the kernel $K_{i,j}$ via the shuffler $\Phi_{i-1}$ (which, in this direction of propagation, refers to the inverse shuffling operation $\varphi_{i-1}^{-1}$) at the depth position i−1 (sub-polarization stage).

In a step S709, the decoder 120 updates the performance-improvement metric $\mathcal{M}$ for each neighbour kernels of the W kernels that have been extracted from the list $\mathcal{L}$ in the step S705, in accordance with the LLRs update performed in the step S708.

In a step S710, the decoder 120 reorders the kernels in the list $\mathcal{L}$ following the changes made on the performance-improvement metric $\mathcal{M}$ in the steps S707 and S709, still in decreasing order of the performance-improvement metric $\mathcal{M}$.

In a step S711, the decoder 120 checks whether the stop condition is met, as already described with respect to FIG. 5. When the stop condition is met, a step S712 is performed; otherwise, the step S705 is repeated with the list $\mathcal{L}$ that has been reordered in the step S710.

In the step S712, the beliefs propagation ends up by returning the output beliefs $\hat{L}_{i,j'}^{(in)}$ and $\hat{L}_{i,j'}^{(out)}$ $\forall i, j'$, in order to enable making a decoding decision as is.

The invention claimed is:

1. A method for performing beliefs propagation in a scope of polar code decoding by a decoder, the polar code having a size of N bits and being based on a structure of L sub-polarization stages of N/2 parallel kernels $K_{i,j}$, wherein N and L being positive integers such that $N=2^L$, wherein i is an index that identifies the sub-polarization stage of a kernel $K_{i,j}$ and j is an index that represents a position of said kernel $K_{i,j}$ among the N/2 parallel kernels at the sub-polarization stage identified by the index r, the N/2 parallel kernels at each sub-polarization stage are separated from their neighbour N/2 parallel kernels at each adjacent sub-polarization stage by a shuffler ($\Phi_i$), characterized in that the decoder performs:

computing a value $\mathcal{M}$ (i,j) of a performance-improvement metric $\mathcal{M}$ for each kernel $K_{i,j}$ of the structure, wherein the performance-improvement metric $\mathcal{M}$ is representative of a magnitude in which input beliefs of a considered kernel $K_{i,j}$ are not in agreement or the performance-improvement metric $\mathcal{M}$ is representative of a magnitude in which output beliefs of the considered kernel $K_{i,j}$ bring instantaneous information rate to the neighbour kernels of said considered kernel $K_{i,j}$; and sorting the kernels in a list $\mathcal{L}$ in decreasing order of the values $\mathcal{M}$ (i,j) of the performance-improvement metric $\mathcal{M}$;

further in that the decoder performs a beliefs propagation iterative process as follows:

updating output beliefs for the W top kernels of the list $\mathcal{L}$, wherein W is a positive integer, and propagating said output beliefs as input beliefs of neighbour kernel of said W top kernels;

updating output beliefs for each neighbour kernel of said W top kernels following update of their input beliefs, and re-computing the performance-improvement metric value $\mathcal{M}$ (i,j) for each said neighbour kernel;

setting the performance-improvement metric $\mathcal{M}$ for said W top kernels to a null value; and re-ordering the kernels in the list $\mathcal{L}$ in decreasing order of the values $\mathcal{M}$ (i,j) of the performance-improvement metric $\mathcal{M}$;

and in that the decoder repeats the beliefs propagation iterative process until a stop condition is met, wherein repeating the beliefs propagation iterative process allows a processor of the decoder to perform the polar code decoding during inactivity time of processing resources of the decoder, and the stop condition is met when one of the following conditions is fulfilled:

when a time period of predefined duration has ended since the beliefs propagation iterative process has started;

when a predefined quantity of iterations has been performed in the beliefs propagation iterative process; and when the value $\mathcal{M}$ (i,j) of the performance-improvement metric $\mathcal{M}$ of the kernel at the top position in the list $\mathcal{L}$ is below a predefined threshold.

2. The method according to claim 1, wherein the value $\mathcal{M}$ (i,j) of the performance-improvement metric $\mathcal{M}$ for each kernel $K_{i,j}$ depends on a difference between the sum of the information rate associated to the input beliefs of said kernel $K_{i,j}$, and the sum of the information rate associated to each input belief of said kernel $K_{i,j}$ before the previous update of said kernel $K_{i,j}$.

3. The method according to claim 2, wherein the value $\mathcal{M}$ (i,j)=$\mathcal{M}^{(1)}$(i,j) of the performance-improvement metric $\mathcal{M}$ for each kernel $K_{i,j}$ is defined as follows $$\mathcal{M}^{(1)}(i,j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

and $$\mathcal{M}^{(3)}(i,j) = \left|\log_2\left(1 + e^{-\hat{L}_{i,2j-1}^{(in)}}\right) + \log_2\left(1 + e^{-\hat{L}_{i,2j}^{(in)}}\right) - \log_2\left(1 + e^{-L_{i,2j-1}^{(out)}}\right) - \log_2\left(1 + e^{-L_{i,2j}^{(out)}}\right)\right|$$

wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1, and wherein $m_{i,j}^{(1)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed from the input beliefs $L_{i,2j-1:2j}^{(in)}$ and $L_{i,2j-1:2j}^{(out)}$, so as to be used in a later update of the performance-improvement metric value $\mathcal{M}$ (i,j)=$\mathcal{M}$ (i,j), and wherein $m_{i,j}^{(1)old}=0$ at the very first computation of the performance-improvement metric value $\mathcal{M}^{(1)}$(i,j) for the kernel $K_{i,j}$.

4. The method according to claim 1, wherein the value $\mathcal{M}$ (i,j) of the performance-improvement metric $\mathcal{M}$ for each kernel $K_{i,j}$ depends on a sum rate difference between the sum of the information rate associated to input ex post beliefs of said kernel $K_{i,j}$, and the sum of the information rate associated to input ex post beliefs of said kernel $K_{i,j}$ before the previous update of said kernel $K_{i,j}$ wherein ex-post belief is a sum of a-priori beliefs and extrinsic beliefs.

5. The method according to claim 4, wherein the value $\mathcal{M}$ (i,j)=$\mathcal{M}^{(2)}$(i,j) of the performance-improvement metric $\mathcal{M}$ for each kernel $K_{i,j}$ is defined as follows $$\mathcal{M}^{(1)}(i,j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

and $$\mathcal{M}^{(3)}(i,j) = \left|\log_2\left(1 + e^{-\hat{L}_{i,2j-1}^{(in)}}\right) + \log_2\left(1 + e^{-\hat{L}_{i,2j}^{(in)}}\right) - \log_2\left(1 + e^{-L_{i,2j-1}^{(out)}}\right) - \log_2\left(1 + e^{-L_{i,2j}^{(out)}}\right)\right|$$

wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1 and wherein $\hat{L}_{i,2j-1:2j}^{(in)old}$ represents the immediately preceding respective values of $\hat{L}_{i,2j-1:2j}^{(in)}$ which are the output beliefs toward the sub-polarization stage and i−1, and $\hat{L}_{i,2j-1:2j}^{(out)old}$ represents the immediately preceding values of $\hat{L}_{i,2j-1:2j}^{(out)}$ which are the output beliefs toward the sub-polarization stage i+1.

6. The method according to claim 1, wherein the value $\mathcal{M}(i,j)$ of the performance-improvement metric $\mathcal{M}$ for each kernel $K_{i,j}$ depends on an increase of information output by the kernel $K_{i,j}$ during the last update of said kernel $K_{i,j}$.

7. The method according to claim 6, wherein the value $\mathcal{M}(i,j) = \mathcal{M}^{(3)}(i,j)$ of the performance-improvement metric $\mathcal{M}$ for each kernel $K_{i,j}$ is defined as follows
$\mathcal{M}^{(3)}(i,j) = |\log_2(1 + e^{-\hat{L}_{i,2j-1}^{(in)}}) + \log_2(1 + e^{-\hat{L}_{i,2j}^{(in)}}) - \log_2(1 + e^{-\hat{L}_{i,2j-1}^{(out)}}) - \log_2(1 + e^{-\hat{L}_{i,2j}^{(out)}})|$ and wherein $\hat{L}_{i,2j-1:2j}^{(in)}$ are the output beliefs toward the sub-polarization stage i−1 and $\hat{L}_{i,2j-1:2j}^{(out)}$ are the output beliefs toward the sub-polarization stage i+1.

8. The method according to claim 2, wherein the value $\mathcal{M}(i,j)$ of the performance-improvement metric $\mathcal{M}$ for each kernel $K_{i,j}$ further depends on an increase of information output by the kernel $K_{i,j}$ during the last update of said kernel $K_{i,j}$.

9. The method according to claim 8, wherein the value $\mathcal{M}(i,j) = \mathcal{M}^{(1)}(i,j) + \mathcal{M}^{(3)}(i,j)$ of the performance-improvement metric $\mathcal{M}$ for each kernel $K_{i,j}$ is defined as follows $$\mathcal{M}^{(1)}(i,j) = |m_{i,j}^{(1)} - m_{i,j}^{(1)old}|$$

wherein $$m_{i,j}^{(1)} = 1 - \frac{1}{4}\left(\log_2\left(1 + e^{-L_{i,2j-1}^{(in)}}\right) + \log_2\left(1 + e^{-L_{i,2j}^{(in)}}\right) + \log_2\left(1 + e^{-L_{i,2j-1}^{(out)}}\right) + \log_2\left(1 + e^{-L_{i,2j}^{(out)}}\right)\right)$$

and
$\mathcal{M}^{(3)}(i,j) = |\log_2(1 + e^{-\hat{L}_{i,2j-1}^{(in)}}) + \log_2(1 + e^{-\hat{L}_{i,2j}^{(in)}}) - \log_2(1 + e^{-\hat{L}_{i,2j-1}^{(out)}}) - \log_2(1 + e^{-\hat{L}_{i,2j}^{(out)}})|$ wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1,
wherein $\hat{L}_{i,2j-1:2j}^{(in)}$ are the output beliefs toward the sub-polarization stage i−1, and $\hat{L}_{i,2j-1:2j}^{(out)}$ are the output beliefs toward the sub-polarization stage i+1,
and wherein $m_{i,j}^{(m)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed from the input beliefs $L_{i,2j-1:2j}^{(in)}$ and $L_{i,2j-1:2j}^{(out)}$, so as to be used in a later update of the performance-improvement metric value $\mathcal{M}^{(1)}(i,j) = \mathcal{M}^{(1)}(i,j)$, and wherein $m_{i,j}^{(1)old}=0$ at the very first computation of the performance-improvement metric value $\mathcal{M}^{(1)}(i,j)$ for the kernel $K_{i,j}$.

10. The method according to claim 8, wherein the value $\mathcal{M}(i,j) = \mathcal{M}^{(1)}(i,j) \cdot \mathcal{M}^{(3)}(i,j)$ of the performance-improvement metric $\mathcal{M}$ for each kernel $K_{i,j}$ is defined as follows:

$$\mathcal{M}^{(2)}(i,j) = |m_{i,j}^{(2)} - m_{i,j}^{(2)old}|$$

wherein $$m_{i,j}^{(2)} = 1 - \frac{1}{4}\left(\log_2\left(1 + e^{-\left(L_{i,2j-1}^{(in)} + \hat{L}_{i,2j-1}^{(in)old}\right)}\right) + \log_2\left(1 + e^{-\left(L_{i,2j}^{(in)} + \hat{L}_{i,2j}^{(in)old}\right)}\right) + \log_2\left(1 + e^{-\left(L_{i,2j-1}^{(out)} + \hat{L}_{i,2j-1}^{(out)old}\right)}\right) + \log_2\left(1 + e^{-\left(L_{i,2j}^{(out)} + \hat{L}_{i,2j}^{(out)old}\right)}\right)\right)$$

and $\mathcal{M}^{(3)}(i,j) = |\log_2(1 + e^{-\hat{L}_{i,2j-1}^{(in)}}) + \log_2(1 + e^{-\hat{L}_{i,2j}^{(in)}}) - \log_2(1 + e^{-\hat{L}_{i,2j-1}^{(out)}}) - \log_2(1 + e^{-\hat{L}_{i,2j}^{(out)}})|$ wherein $L_{i,2j-1:2j}^{(in)}$ are the input beliefs coming from the sub-polarization stage i−1 and $L_{i,2j-1:2j}^{(out)}$ are the input beliefs coming from the sub-polarization stage i+1,
wherein $\hat{L}_{i,2j-1:2j}^{(in)}$ are the output beliefs toward the sub-polarization stage i−1, and $\hat{L}_{i,2j-1:2j}^{(out)}$ are the output beliefs toward the sub-polarization stage i+1,
and wherein $m_{i,j}^{(1)}$ becomes $m_{i,j}^{(1)old}$ after each effective update of the kernel $K_{i,j}$, during which the output beliefs $\hat{L}_{i,2j-1:2j}^{(in)}$ and $\hat{L}_{i,2j-1:2j}^{(out)}$ are computed from the input beliefs $L_{i,2j-1:2j}^{(in)}$ and $L_{i,2j-1:2j}^{(out)}$, so as to be used in a later update of the performance-improvement metric value $\mathcal{M}(i,j) = \mathcal{M}^{(1)}(i,j)$, and wherein in $m_{i,j}^{(1)old}=0$ at the very first computation of the performance-improvement metric value $\mathcal{M}^{(1)}(i,j)$ for the kernel $K_{i,j}$.

11. A computer program product comprising program code instructions that can be loaded in a programmable device for implementing the method according to claim 1, when the program code instructions are run by the programmable device.

12. Non-transitory information storage medium storing a computer program comprising program code instructions that can be loaded in a programmable device for implementing the method according to claim 1, when the program code instructions are run by the programmable device.

13. A polar code decoder configured for performing beliefs propagation in a scope of polar code decoding, the polar code having a size of N bits and being based on a structure of L sub-polarization stages of N/2 parallel kernels $K_{i,j}$, wherein N and L being positive integers such that $N=2^L$, wherein i is an index that identifies the sub-polarization stage of a kernel $K_{i,j}$ and j is an index that represents a position of said kernel $K_{i,j}$ among the N/2 parallel kernels at the sub-polarization stage identified by the index i, the N/2 parallel kernels at each sub-polarization stage are separated from their neighbour N/2 parallel kernels at each adjacent sub-polarization stage by a shuffler ($\Phi_i$), characterized in that the decoder performs:
  computing a value $\mathcal{M}(i,j)$ of a performance-improvement metric $\mathcal{M}$ for each kernel $K_{i,j}$ of the structure, wherein the performance-improvement metric $\mathcal{M}$ is representative of a magnitude in which input beliefs of a considered kernel $K_{i,j}$ are not in agreement or the performance-improvement metric $\mathcal{M}$ is representative of a magnitude in which output beliefs of the considered kernel $K_{i,j}$ bring instantaneous information rate to the neighbour kernels of said considered kernel $K_{i,j}$; and
  sorting the kernels in a list $\mathcal{M}$ in decreasing order of the values $\mathcal{M}(i,j)$ of the performance-improvement metric $\mathcal{M}$;
further in that the decoder comprises a processor to perform a beliefs propagation iterative process including:

updating output beliefs for the W top kernels of the list $\mathcal{L}$, wherein W is a positive integer, and propagating said output beliefs as input beliefs of neighbour kernel of said W top kernels;

updating output beliefs for each neighbour kernel of said W top kernels following update of their input beliefs; and re-computing the performance-improvement metric value $\mathcal{M}(i,j)$ for each said neighbour kernel;

setting the performance-improvement metric $\mathcal{M}$ for said W top kernels to a null value; and re-ordering the kernels in the list $\mathcal{L}$ in decreasing order of the values $\mathcal{M}(i,j)$ of the performance-improvement metric $\mathcal{M}$;

and in that the decoder is further configured for repeating the beliefs propagation iterative process until a stop condition is met, wherein repeating the beliefs propagation iterative process allows the processor of the decoder to perform the polar code decoding during inactivity time of processing resources of the decoder, and the stop condition is met when one of the following conditions is fulfilled:

when a time period of predefined duration has ended since the beliefs propagation iterative process has started;

when a predefined quantity of iterations has been performed in the beliefs propagation iterative process; and when the value $\mathcal{M}(i,j)$ of the performance-improvement metric $\mathcal{M}$ of the kernel at the top position in the list $\mathcal{L}$ is below a predefined threshold.

* * * * *